(12) United States Patent
Ohtani et al.

(10) Patent No.: US 8,053,272 B2
(45) Date of Patent: Nov. 8, 2011

(54) SEMICONDUCTOR DEVICE FABRICATION METHOD

(75) Inventors: Akira Ohtani, Ebina (JP); Takanori Watanabe, Yamato (JP); Takeshi Ichikawa, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/692,804

(22) Filed: Jan. 25, 2010

(65) Prior Publication Data

US 2010/0203670 A1 Aug. 12, 2010

(30) Foreign Application Priority Data

Feb. 6, 2009 (JP) .................................. 2009-026702

(51) Int. Cl.
*H01L 21/00* (2006.01)

(52) U.S. Cl. ... 438/98; 438/296; 438/305; 257/E21.551; 257/E21.576; 257/E21.585

(58) Field of Classification Search .................... 438/98, 438/246–296; 257/297–431, E21.585
See application file for complete search history.

(56) References Cited

U.S. PATENT DOCUMENTS

| | | | | |
|---|---|---|---|---|
| 5,466,961 A | | 11/1995 | Kikuchi et al. ................ 257/379 |
| 5,693,959 A | | 12/1997 | Inoue et al. ...................... 257/66 |
| 6,207,981 B1 | * | 3/2001 | Hatano et al. .................. 257/221 |
| 6,429,471 B1 | * | 8/2002 | Yokoyama et al. ............ 257/289 |
| 7,229,878 B2 | * | 6/2007 | Jeon ............................... 438/246 |
| 7,323,731 B2 | | 1/2008 | Yuzurihara et al. ............ 257/292 |
| 7,540,198 B2 | | 6/2009 | Ichikawa ......................... 73/754 |
| 2005/0116259 A1 | | 6/2005 | Komori .......................... 257/222 |
| 2005/0173772 A1 | * | 8/2005 | Kim et al. ...................... 257/431 |
| 2006/0081957 A1 | | 4/2006 | Itonaga et al. ................. 257/444 |
| 2006/0131621 A1 | | 6/2006 | Shin et al. ...................... 257/292 |
| 2006/0131624 A1 | | 6/2006 | Katsuno et al. ................ 257/292 |
| 2006/0244020 A1 | | 11/2006 | Lee ................................. 257/291 |
| 2007/0023796 A1 | | 2/2007 | Adkisson et al. .............. 257/290 |
| 2007/0108371 A1 | | 5/2007 | Stevens et al. ............. 250/214.1 |
| 2007/0141801 A1 | | 6/2007 | Kwon et al. ................... 438/400 |
| 2008/0035963 A1 | | 2/2008 | Kwon et al. ................... 257/291 |
| 2008/0036019 A1 | | 2/2008 | Tamura et al. ................. 257/431 |
| 2008/0057615 A1 | | 3/2008 | Okagawa et al. ............... 438/73 |

FOREIGN PATENT DOCUMENTS

| | | |
|---|---|---|
| EP | 1 505 655 A2 | 2/2005 |
| EP | 1 858 082 A1 | 11/2007 |
| JP | 2006-120679 A | 5/2006 |
| JP | 2007-073544 A | 3/2007 |
| JP | 2008-085304 A | 4/2008 |
| JP | 2008-153566 A | 7/2008 |
| WO | WO 2005/096384 A1 | 10/2005 |

* cited by examiner

*Primary Examiner* — Charles Garber
*Assistant Examiner* — Abdulfattah Mustapha
(74) *Attorney, Agent, or Firm* — Fitzpatrick, Cella, Harper & Scinto

(57) ABSTRACT

A method of fabricating a semiconductor device, comprises steps of forming a common contact hole for a first conductivity-type region and a second conductivity-type region, implanting an impurity in at least one of the first conductivity-type region and the second conductivity-type region, and forming a shared contact plug by filling an electrical conducting material in the contact hole, wherein in the implanting step, an impurity is implanted in at least one of the first conductivity-type region and the second conductivity-type region such that the first conductivity-type region and the shared contact plug are brought into ohmic contact with each other, and the second conductivity-type region and the shared contact plug are brought into ohmic contact with each other.

10 Claims, 11 Drawing Sheets

A-A'

SEMICONDUCTOR DEVICE FABRICATION METHOD

BACKGROUND OF THE INVENTION

1. Field of the Invention

The present invention relates to a semiconductor device fabrication method.

2. Description of the Related Art

Japanese Patent Laid-Open No. 2008-85304 relates to a method of fabricating a MOS photoelectric conversion device. This reference has disclosed a technique by which the gate of an amplifier MOS transistor in a pixel is connected to a floating diffusion by a shared contact plug. The shared contact technique is advantageous in downsizing semiconductor devices.

Japanese Patent Laid-Open No. 2008-85304 does not mention the relationship between the conductivity type or impurity concentration of a diffusion region to be connected by the shared contact plug and the conductivity type or impurity concentration of the gate of a MOS transistor.

When two regions to be connected by the shared contact plug have opposite conductivity types, the shared contact plug must be brought into ohmic contact with both of the two regions. However, no reference has discussed this subject. It is difficult to obtain a highly integrated, low-noise, high-speed semiconductor device unless ohmic contacts with these two regions are achieved.

SUMMARY OF THE INVENTION

The present invention provides a highly integrated, low-noise, high-speed semiconductor device.

One of the aspects of the present invention provides a method of fabricating a semiconductor device, comprising the steps of forming a common contact hole for a first conductivity-type region and a second conductivity-type region, implanting an impurity in at least one of the first conductivity-type region and the second conductivity-type region, and forming a shared contact plug by filling an electrical conducting material in the contact hole, wherein in the implanting step, an impurity is implanted in at least one of the first conductivity-type region and the second conductivity-type region such that the first conductivity-type region and the shared contact plug are brought into ohmic contact with each other, and the second conductivity-type region and the shared contact plug are brought into ohmic contact with each other.

Further features of the present invention will become apparent from the following description of exemplary embodiments with reference to the attached drawings.

DESCRIPTION OF THE EMBODIMENTS

Embodiments of the present invention will be explained below with reference to the accompanying drawing.

The present invention is applicable to the fabrication of every semiconductor device having a shared contact plug that connects two regions different in conductivity type, for example, the fabrication of a photoelectric conversion device. In the following description, an example in which the present invention is provided to the fabrication of a photoelectric conversion device will be explained in order to provide a more practical example. However, the present invention can also be applied to the fabrication of other semiconductor devices such as a memory circuit, analog circuit, and logic circuit.

Figure 1:
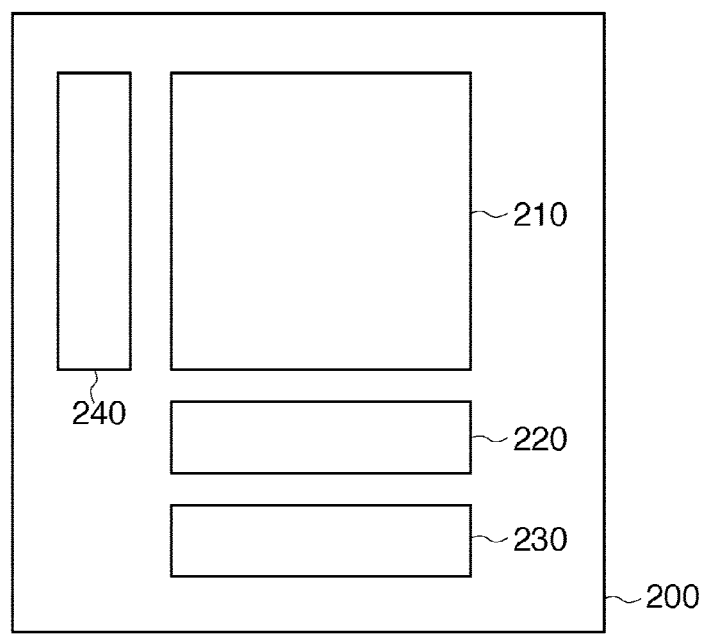
FIG. 1 is a view showing an outline of the arrangement of an image sensing device of an embodiment of the present invention.

FIG. 1 is a view showing an outline of the arrangement of an image sensing device 200 of an embodiment of the present invention. The image sensing device 200 is formed on a semiconductor substrate, and can be called a solid-state image sensor, MOS image sensor, CMOS sensor, or the like. The image sensing device 200 is a form of photoelectric conversion devices, and the photoelectric conversion devices include, for example, a linear sensor and light quantity sensor in addition to an image sensor.

The photoelectric conversion devices are classified into the first type in which, of electrons and holes generable by photoelectric conversion, the holes are read out as a signal, and the second type in which, of electrons and holes generable by photoelectric conversion, the electrons are read out as a signal. In this embodiment, the first type will be explained first, and then an application to the second type will be mentioned.

This specification and the scope of claims use terms "the first conductivity type" and "the second conductivity type", but these terms are merely used to distinguish between the two conductivity types.

The image sensing device 200 of the embodiment of the present invention includes a pixel array 210 in which pixels are two-dimensionally arranged to form a plurality of rows and a plurality of columns. The image sensing device 200 can also include a row selecting circuit 240 for selecting a row in the pixel array 210, a column selecting circuit 230 for selecting a column in the pixel array 210, and a read circuit 220 for reading out a signal from the column selected in the pixel array 210 by the column selecting circuit 230. The row selecting circuit 240 and column selecting circuit 230 can include, for example, shift registers, and can also be configured to randomly access the rows and columns, respectively.

Figure 2:
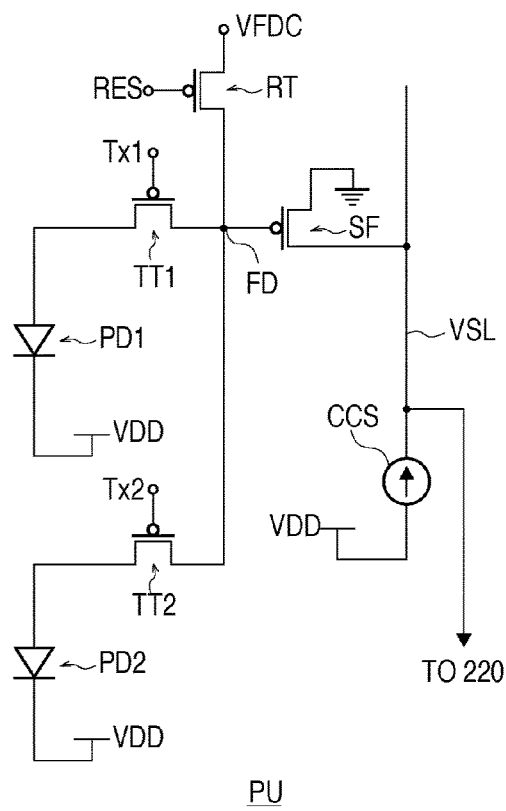
FIG. 2 is a circuit diagram showing a configuration example of a pixel unit of a pixel array.

FIG. 2 is a circuit diagram showing a configuration example of a pixel unit PU of the pixel array 210. In this configuration example, the pixel unit PU includes two pixels. In other embodying forms, however, the pixel unit PU can form a single pixel and can also include three or more pixels. Of electrons and holes generable by photoelectric conversion, the pixel unit PU is configured to read out the holes as a signal. The pixel array 210 is formed by two-dimensionally arranging the pixel units PU each including at least one pixel.

In the configuration example shown in FIG. 2, the pixel unit PU can include two photodiodes PD1 and PD2, two transfer transistors TT1 and TT2, an amplifier transistor SF, and a reset transistor RT. The photodiodes PD1 and PD2 and transfer transistors TT1 and TT2 share the amplifier transistor SF and reset transistor RT. The transfer transistors TT, that is, TT1 and TT2, amplifier transistor SF, and reset transistor RT are formed by PMOS transistors.

The transfer transistors TT1 and TT2 are turned on when active pulses (Low pulses) are applied to transfer signal lines Tx1 and Tx2 connected to the gates of the transfer transistors TT1 and TT2. Consequently, holes stored in storage regions (p-type regions) of the photodiodes PD1 and PD2 are transferred to a floating diffusion FD. Note that the photodiodes PD1 and PD2 are arranged to form different rows, and the active pulses are applied to the transfer signal lines Tx1 and Tx2 at different timings.

The amplifier transistor SF forms a source follower circuit together with a constant-current source CCS for supplying a constant current to a vertical signal line (column signal line) VSL. The amplifier transistor SF amplifies, by a source follower operation, a signal (potential change) appearing in the floating diffusion FD when holes are transferred to the floating diffusion FD via the transfer transistors TT, and outputs the amplified signal to the vertical signal line VSL. The read circuit 220 reads out the signal output to the vertical signal line VSL. When an active pulse (Low pulse) is applied to a reset signal line RES connected to the gate of the reset transistor RT, the reset transistor RT is turned on to reset the floating diffusion FD.

In the configuration example shown in FIG. 2, a row is selected by controlling a potential VFDC applied to the drain electrode of the reset transistor RT. A row in which the potential of the floating diffusion FD is reset to a potential at which the amplifier transistor SF is not turned on is not selected. A row in which the potential of the floating diffusion FD is reset to a potential at which the amplifier transistor SF is turned on is selected. In another embodying form, a selection transistor for selecting a row can be formed in series with the amplifier transistor SF between the ground potential and vertical signal line VSL. The selection transistor can be formed between the ground potential and amplifier transistor SF, or between the amplifier transistor SF and vertical signal line VSL.

Figure 3:
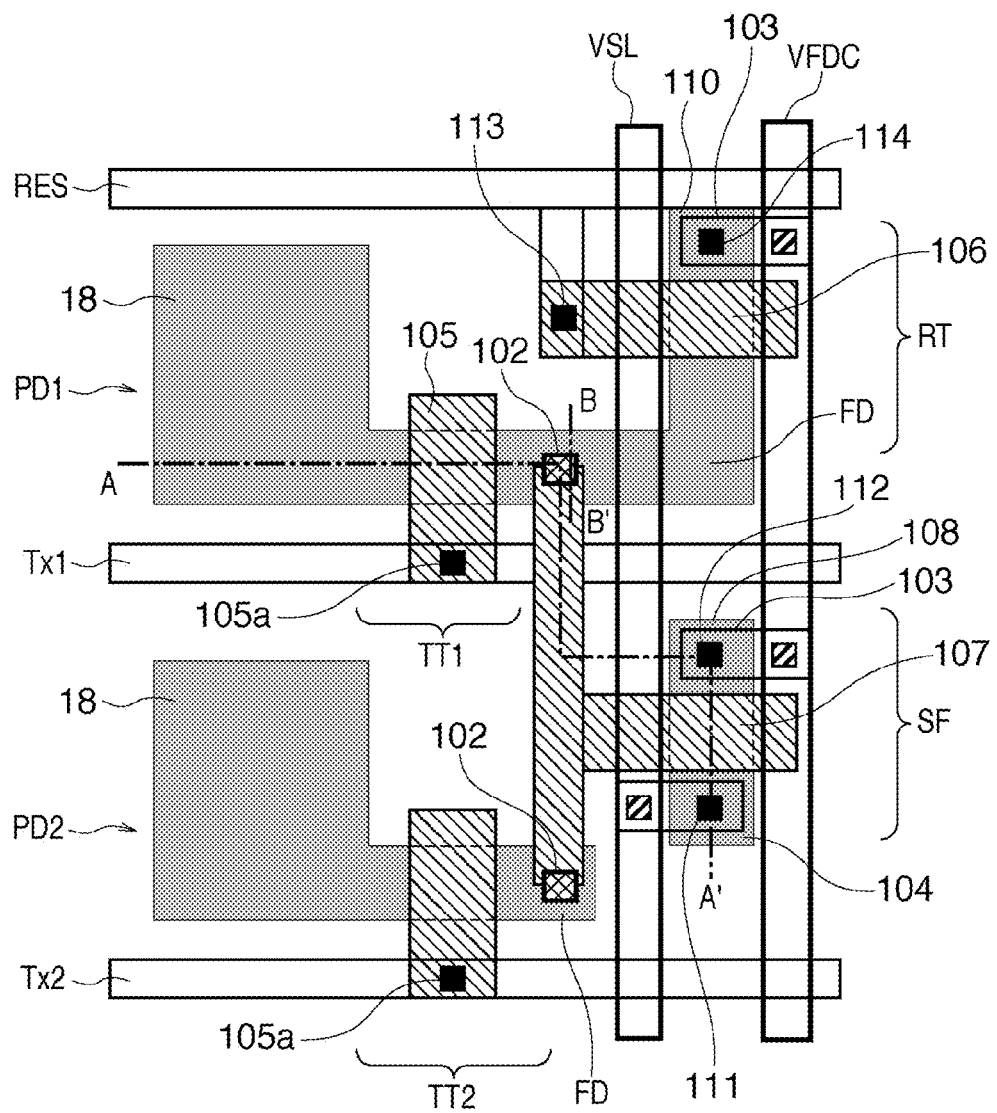
FIG. 3 is a layout view showing a configuration example of the pixel unit forming the pixel array.
Figure 4:
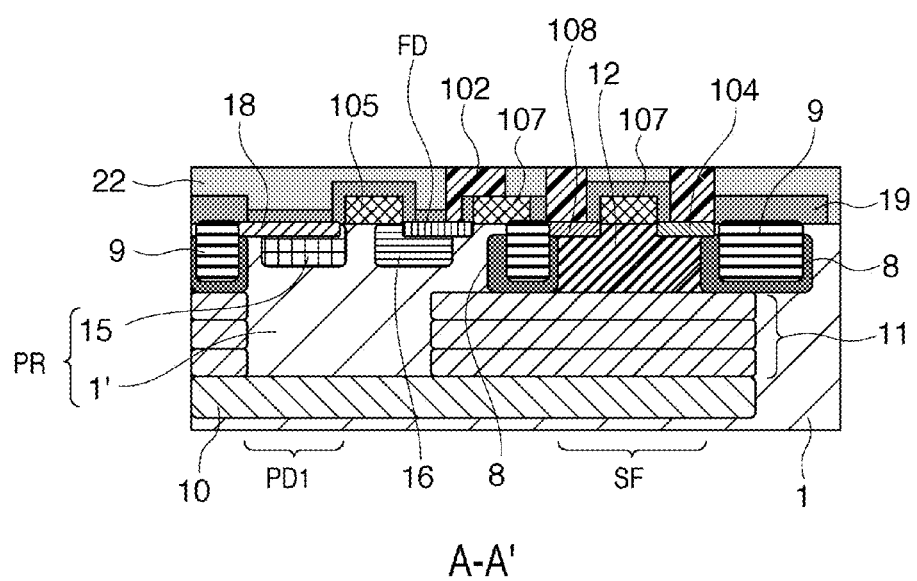
FIG. 4 is an exemplary sectional view taken along a line A-A' in FIG. 3.

FIG. 3 is a layout view showing a configuration example of the pixel unit PU forming the pixel array 210. FIG. 4 is an exemplary sectional view taken along a line A-A' in FIG. 3.

In this embodiment, each of the photodiodes PD (PD1 and PD2) is formed by a p-type region PR, and an n-type buried layer 10 formed below the p-type region PR. The p-type region PR is an anode, and the buried layer 10 is a cathode. The p-type region PR includes a first p-type region 15 and second p-type region 1'. At least a portion of the second region 1' is formed between the first region 15 and n-type buried layer 10. The first region 15 functions as a main charge storage region. The concentration of a p-type impurity in the second region 1' can be the same as that of a p-type silicon substrate (semiconductor substrate) 1. The concentration of a p-type impurity in the first region 15 is higher than that of the p-type impurity in the second region 1'. The p-type region PR is preferably formed below an n-type surface region 18. In this case, the n-type surface region 18, p-type region PR, and n-type buried layer 10 form a buried photodiode PD. In the buried photodiode, noise produced by a dark current is small.

The diffusion coefficient of a dominant impurity in the n-type surface region 18 is favorably smaller than that of a dominant impurity in the buried layer 10. For example, the dominant impurity of the n-type surface region 18 is preferably arsenic (As), and that of the buried layer 10 is preferably phosphorus (P). The diffusion coefficient of arsenic (As) is smaller than that of phosphorus (P). Therefore, forming the surface region 18 by arsenic (As) is advantageous in micro-patterning because the boundary is readily determined. On the other hand, phosphorus (P) can easily penetrate to a deep position in a semiconductor substrate when compared to arsenic (As). Accordingly, forming the buried layer 10 by phosphorus (P) is advantageous in increasing the sensitivity because the buried layer 10 can be formed in a deep position. Also, since the diffusion coefficient of phosphorus (P) is larger than that of arsenic (As), forming the buried layer 10 by phosphorus (P) is advantageous in forming a widely distributed potential barrier. Furthermore, the ion radius of phosphorus (P) is larger than the lattice constant of the silicon substrate 1. Therefore, implanting phosphorus in the silicon substrate 1 is advantageous in straining the lattice of the silicon substrate 1, thereby achieving the effect of gettering an impurity metal element. This helps improve point defects. The buried layer 10 can be formed by ion-implanting phosphorus (P) in the semiconductor substrate 1 by using the channeling phenomenon. In the present invention, impurities to be implanted or doped are not limited to arsenic (As) and phosphorus (P), and other impurities may also be used.

The floating diffusion FD is a third p-type region. A gate 105 of each of the transfer transistors TT, that is, TT1 and TT2 is formed on a region between the first p-type region 15 forming a part of the photodiode PD and the floating diffusion FD (third p-type region). In other words, the first p-type region 15, floating diffusion FD (third p-type region), and gate 105 form the transfer transistor TT. The transfer transistor TT transfers holes stored in the p-type regions 15 and 1' of the photodiode PD to the floating diffusion FD. In this embodiment, the transfer transistor TT is a PMOS transistor. The gate 105 of the transfer transistor TT can be made of polysilicon.

The second p-type region 1' can be formed to surround the first p-type region 15 in the section. Alternatively, the element isolation region side of the first p-type region 15 may also be in contact with a channel stop region (to be described later). In this case, the second p-type region 1' surrounds the first p-type region 15 except for the element isolation region side of the first p-type region 15. The second region 1' and floating diffusion FD (third region) are isolated by an n-type region 16, and the channel of the transfer transistor TT is formed in the n-type region 16.

Element isolation regions 9 are arranged to isolate active regions where the photodiode PD, transfer transistor TT, amplifier transistor SF, and reset transistor RT are to be formed. Referring to FIG. 3, the active regions are the surface region 18, the floating diffusion FD, and diffusion regions 104, 108, and 110, and other regions can be the element isolation regions 9. The element isolation regions 9 can typically be formed by using the STI (Shallow Trench Isolation) technique or the LOCOS (LOCal Oxidation of Silicon) technique. It is also possible to use diffusion isolation.

A channel stop region 8 is formed in a region covering at least the lower portion (lower side surfaces and lower surface)

of the element isolation region 9. The diffusion coefficient of a dominant impurity in the channel stop region 8 is favorably smaller than that of the dominant impurity in the buried layer 10. For example, the dominant impurity of the channel stop region 8 is preferably arsenic (As), and that of the buried layer 10 is preferably phosphorus (P). Since the diffusion coefficient of arsenic (As) is smaller than that of phosphorus (P) as described previously, forming the channel stop region 8 by arsenic (As) is advantageous in micropatterning. The dominant impurity of the channel stop region 8 can be the same as that of the surface region 18.

A potential barrier 11 is formed between the photodiodes PD. The potential barrier 11 can also be formed between the photodiode PD and the amplifier transistor SF and reset transistor RT as needed. Note that in a photoelectric conversion device having a single element or in an image sensing device having a large pixel interval, the potential barrier between the photodiodes is unnecessary. Also, when the element isolation regions 9 are formed sufficiently deeply, the potential barrier between the photodiode PD and the amplifier transistor SF and reset transistor RT is unnecessary. In this embodiment, the formation of the potential barrier 11 determines the p-type region 1' surrounded by the potential barrier 11.

A gate 107 of the amplifier transistor SF is electrically connected to the floating diffusion FD. The gate 107 of the amplifier transistor SF can be made of polysilicon. In this embodiment, the gate 107 of the amplifier transistor SF is electrically connected to the floating diffusion FD by a shared contact plug 102. The shared contact plug 102 is advantageous in increasing the aperture ratio or pixel density. The shared contact plug herein mentioned is a contact plug that electrically connects the diffusion region (source or drain) of one transistor and the gate of another transistor by one contact plug.

The amplifier transistor SF is a PMOS transistor including the gate 107 electrically connected to the floating diffusion FD, and the diffusion regions 104 and 108. The reset transistor RT is a PMOS transistor including a gate 106 connected to the reset signal line RES, the floating diffusion FD, and the diffusion region 110. The gate of the reset transistor RT can be made of polysilicon.

The amplifier transistor SF preferably has a buried channel structure. This is so because the 1/f noise can be reduced by giving the buried channel structure to the amplifier transistor SF (the 1/f noise is inversely proportional to the product of the channel width and channel length). On the other hand, the reset transistor RT and transfer transistor TT (if a selection transistor for selecting a row exists, this row selecting transistor), particularly, the reset transistor RT preferably has a surface channel structure. This is so because the OFF state of a transistor is important in order to suppress the leak of holes to the floating diffusion FD. A buried channel transistor is readily normally on and difficult to turn off in some cases. Also, to downsize pixels, it is effective to downsize the reset transistor RT and transfer transistor TT (if a selection transistor for selecting a row exists, this row selecting transistor). A surface channel transistor is advantageous for the purpose.

In this embodiment, the gate of the amplifier transistor SF formed by a PMOS transistor is made of an n-type electrical conducting pattern in order to give the buried channel structure to the amplifier transistor SF. The gate 107 of each of the transfer transistor TT and reset transistor RT each formed by a PMOS transistor can be made of either a p-type electrical conducting pattern or n-type electrical conducting pattern. In either case, the surface channel structure can be given to the transfer transistor TT and reset transistor RT. When the gates of the transfer transistor TT and reset transistor RT are each made of an n-type electrical conducting pattern, the surface channel structure can easily be obtained by decreasing the channel width (e.g., making the channel width smaller than 1 μm). To more stably give the amplifier transistor SF the buried channel structure, channel doping may be performed at a predetermined depth from the interface between a gate insulating film and the silicon substrate 1. The conductivity type of an impurity to be channel-doped is the same as that of the source/drain regions, and the concentration of the impurity is lower than that in the source/drain regions.

In this embodiment as described above, the gate 107 of the amplifier transistor SF formed by a PMOS transistor is an n-type electrical conducting pattern. On the other hand, in this embodiment, the floating diffusion FD connected to the gate 107 by the shared contact plug 102 is a p-type diffusion region. Accordingly, the shared contact plug 102 must electrically be connected to both the n-type electrical conducting pattern as the gate 107 and the p-type diffusion region as the floating diffusion FD. In addition, this electrical connection must be an ohmic contact in order to provide a highly integrated, low-noise, high-speed image sensing device (semiconductor device). A method for the purpose will be explained below with reference to FIGS. 5 and 6 in the following explanation of a semiconductor device fabrication method.

A method of fabricating the image sensing device 200 will exemplarily be explained below as an embodiment of the semiconductor device fabrication method of the present invention with reference to FIGS. 5, 6, 7A to 7D, 8A to 8C, 9A to 9C, 10A, 10B, 11A, and 11B. Note that in the following description, notes will be appended by assuming that the first conductivity type is a p-type and the second conductivity type is an n-type. However, the conductivity types may also be switched.

Figure 7A:
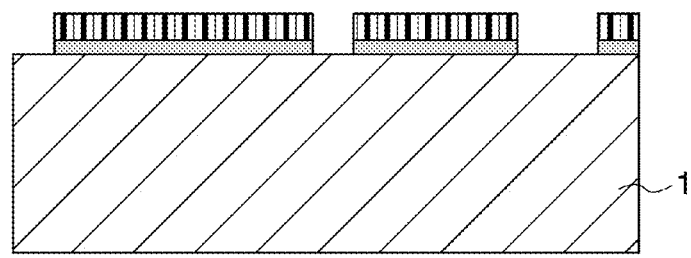
FIGS. 7A to 7D are exemplary views for explaining a method of fabricating the image sensing device of the embodiment of the present invention.

First, in a step shown in FIG. 7A, a p-type silicon substrate 1 is prepared. After a 10- to 200-Å thick silicon oxide film is formed on the surface of the silicon substrate 1, a 400- to 600-Å thick polysilicon film and 150- to 200-Å thick silicon nitride film are sequentially formed, and a mask is formed by patterning these films.

Figure 7B:
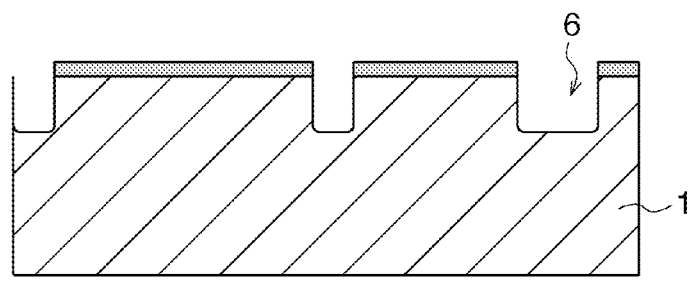
Figure 7C:
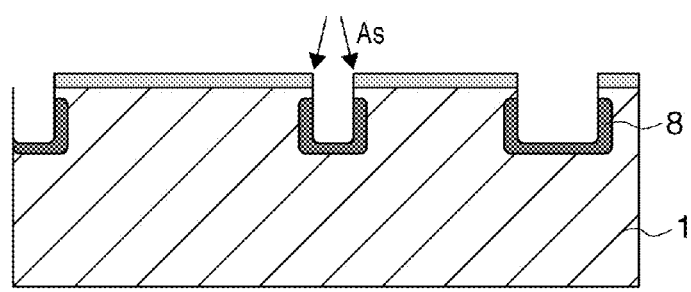
Figure 7D:
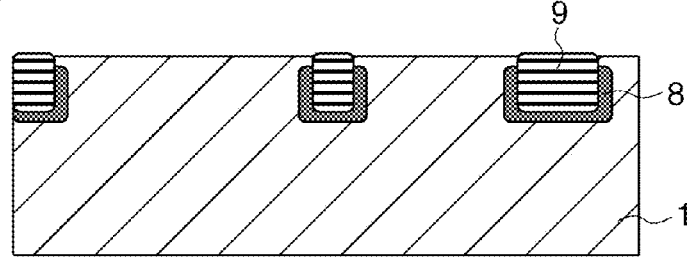

Then, in a step shown in FIG. 7B, trenches 6 for forming element isolation regions 9 are formed by etching the openings of the mask formed in the step shown in FIG. 7A. In a step shown in FIG. 7C, channel stop regions 8 are formed by implanting arsenic (As) at 150 to 200 KeV below and around the lower side portions of the trenches 6. In a step shown in FIG. 7D, element isolation regions (STI) 9 are formed in the trenches 6.

Figure 8A:
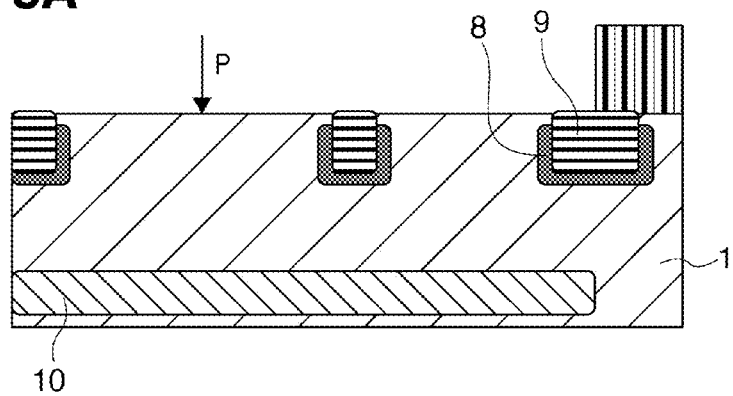
FIGS. 8A to 8C are exemplary views for explaining the method of fabricating the image sensing device of the embodiment of the present invention.
Figure 8B:
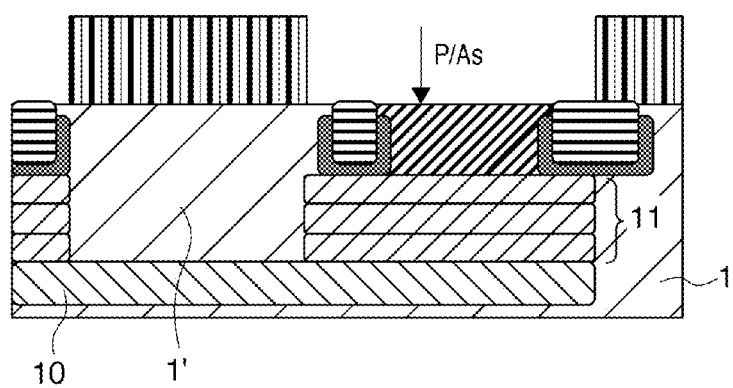

In a step shown in FIG. 8A, an n-type (second conductivity-type) buried layer 10 is formed by implanting phosphorus (P) at 4,000 to 8,000 KeV in a deep portion of the p-type (first conductivity-type) silicon substrate 1. In this step, phosphorus (P) is preferably implanted as deep as possible by using the channeling phenomenon. In a step shown in FIG. 8B, a potential barrier 11 is formed between the photodiodes PD, and between the photodiode PD and the amplifier transistor SF and reset transistor RT as needed. The potential barrier 11 can be formed by implanting, for example, phosphorus (P) at 2,000 to 2,500 KeV, phosphorus (P) at 1,000 to 1,500 KeV, and arsenic (As) at 700 to 750 KeV in the silicon substrate 1.

Figure 8C:
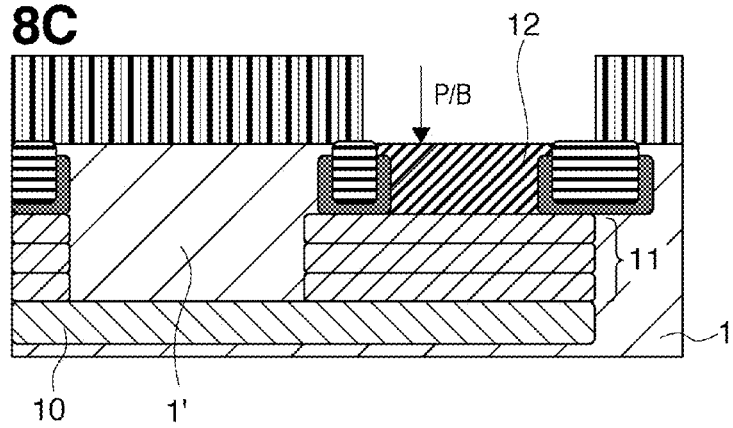

In a step shown in FIG. 8C, a target potential structure is formed by implanting ions in regions where the amplifier transistor SF and reset transistor RT are to be formed. This ion implantation step includes steps such as channel doping. As described previously, it is favorable to form the potential structure such that the amplifier transistor SF has a buried channel structure and the reset transistor RT has a surface channel structure.

Figure 9A:
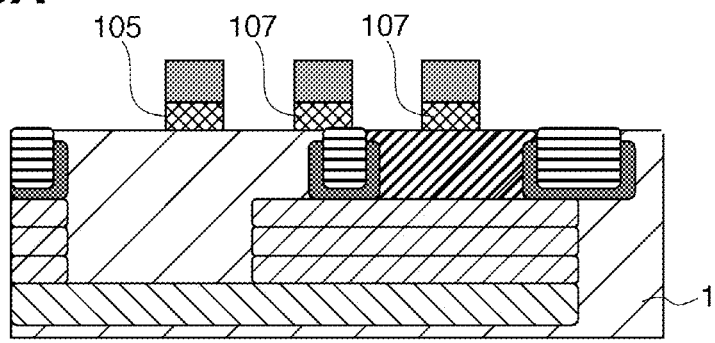
FIGS. 9A to 9C are exemplary views for explaining the method of fabricating the image sensing device of the embodiment of the present invention.

Subsequently, as shown in FIG. 9A, a gate oxide film and polysilicon electrode are formed and patterned to form gates 105 and 107 and a gate 106 (not shown). Of the gates 105 and 107 and the gate 106 (not shown), at least the gate 107 of the amplifier transistor SF (in this embodiment, a PMOS transistor) is formed by an n-type electrical conducting pattern (second conductivity-type region) by implanting or doping an n-type (second conductivity-type) impurity. Note that the gates of PMOS transistors of the peripheral circuits (the row selecting circuit 240, read circuit 220, and column selecting circuit 230) except for the pixel array 210 are preferably formed by p-type electrical conducting patterns.

Figure 9B:
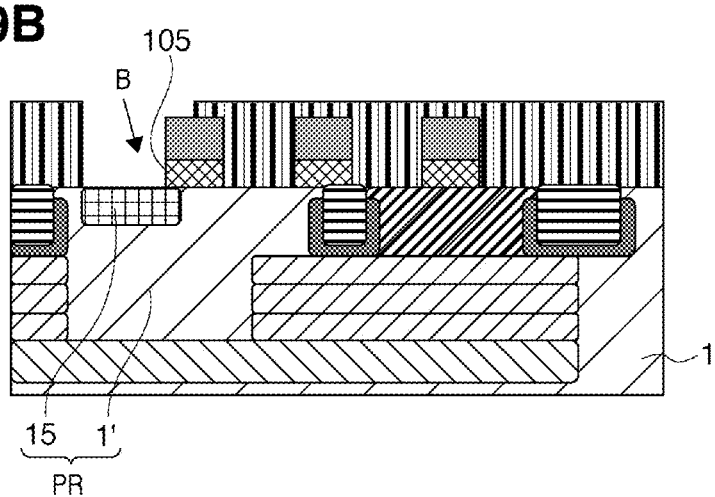
Figure 9C:
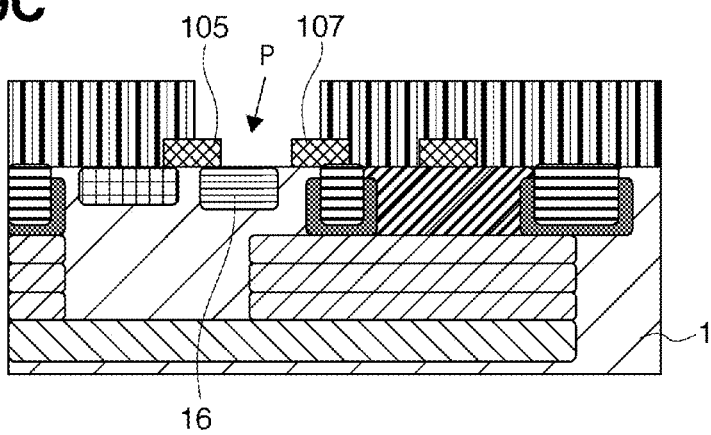

In a step shown in FIG. 9B, boron (B) is implanted at 50 to 150 KeV in the region of the photodiode PD, thereby forming a first region 15 forming a part of the p-type region PR. Then, in a step shown in FIG. 9C, an n-type region 16 is formed by implanting phosphorus (P) at 50 to 150 KeV in a region extending from a portion below the transfer transistor TT toward the floating diffusion FD.

Figure 10A:
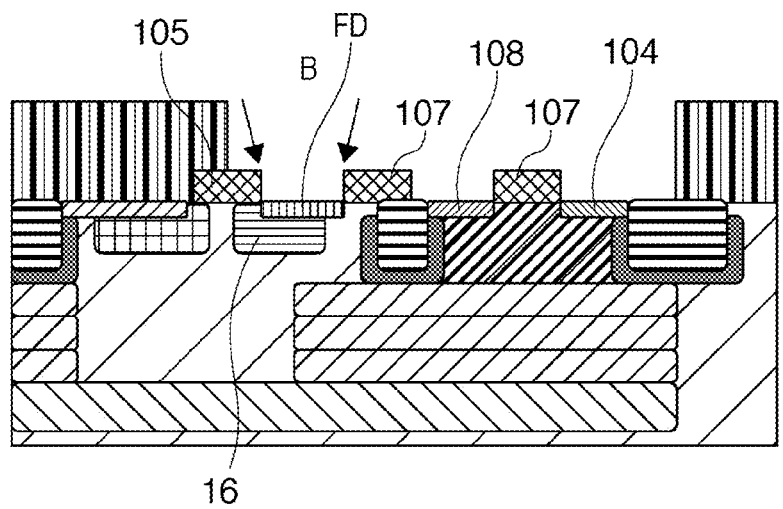
FIGS. 10A and 10B are exemplary views for explaining the method of fabricating the image sensing device of the embodiment of the present invention.
Figure 10B:
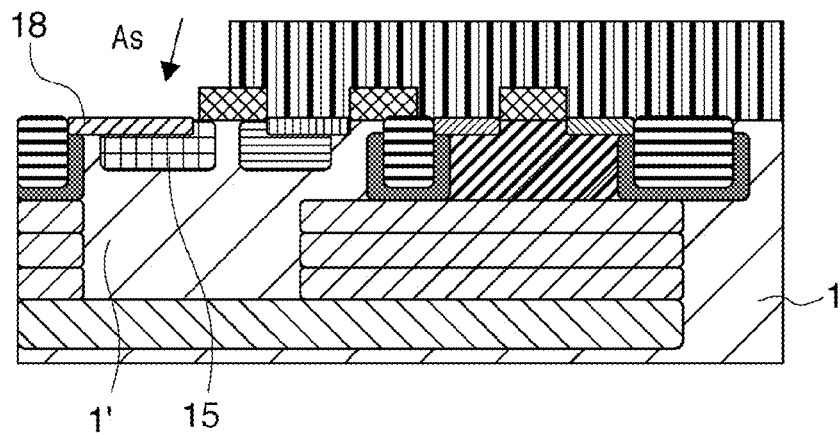

In a step shown in FIG. 10A, boron (B) as an impurity for forming a p-type (first conductivity-type) semiconductor region is implanted at 10 to 15 KeV in regions to be used as the diffusion regions of PMOS transistors, thereby forming a floating diffusion (first conductivity-type region) FD, diffusion regions 108 and 104 and a diffusion region 110 (not shown). The source/drain regions of other transistors are also formed. Then, in a step shown in FIG. 10B, arsenic (As) as an impurity for forming an n-type (second conductivity-type) semiconductor region is implanted at 50 to 100 keV in a region for forming a surface region 18, thereby forming the surface region 18.

Figure 11A:
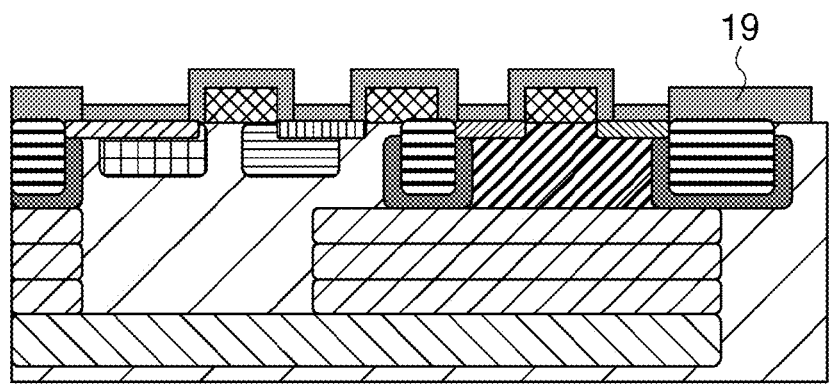
FIGS. 11A and 11B are exemplary views for explaining the method of fabricating the image sensing device of the embodiment of the present invention.

In a step shown in FIG. 11A, a film 19 including a 50- to 100-Å thick silicon oxide film, 400- to 600-Å thick antireflection silicon nitride film, and 500- to 1,000-Å thick protective silicon oxide film is formed. In a step (hole formation step) shown in FIG. 11B, an interlayer dielectric film (e.g., 500- to 1,500-Å thick NSG or 10,000- to 15,000-Å thick BPSG) 22 is formed, and a contact hole 23 is formed in the interlayer dielectric film 22.

Figure 5:
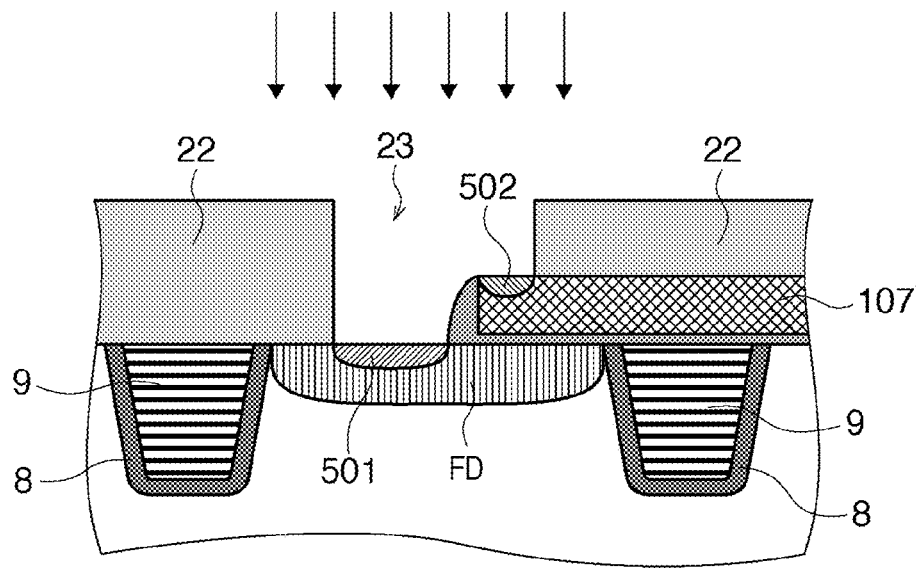
FIG. 5 is an exemplary sectional view taken along a line B-B' in FIG. 3.

FIG. 5 is an exemplary sectional view taken along a line B-B' in FIG. 3. Referring to FIG. 5, the contact hole 23 is formed in the step shown in FIG. 11B, and is a common contact hole for the n-type (first conductivity-type) floating diffusion (first conductivity-type region) FD and the p-type (second conductivity-type) gate (second conductivity-type region) 107. FIG. 5 exemplarily shows an implantation step performed after the hole formation step shown in FIG. 11B. In this implantation step, an impurity is implanted in at least one of the floating diffusion (first conductivity-type region) FD and the gate (second conductivity-type region) 107. The impurity is implanted such that the floating diffusion (first conductivity-type region) FD and the shared contact plug 102 to be formed in a later step are brought into ohmic contact with each other, and the gate (second conductivity-type region) 107 and the shared contact plug 102 are brought into ohmic contact with each other.

Assume that the concentration of the p-type impurity in the floating diffusion FD is $1\times10^{17}$ to $1\times10^{21}$ (/cm$^3$), and the concentration of the n-type (second conductivity-type) impurity in the gate 107 of the amplifier transistor SF is $7\times10^{19}$ to $7\times10^{21}$ (/cm$^3$). In this case, an impurity (boron) for forming a p-type semiconductor region need only be implanted at a dose of $1\times10^{13}$ to $1\times10^{15}$ (/cm$^2$) in both the floating diffusion (first conductivity-type region) FD and the gate (second conductivity-type region) 107 at the same time. Consequently, a contact region 501 meeting the condition (e.g., an impurity concentration of $5\times10^{19}$ to $1\times10^{21}$ (/cm$^3$)) of an ohmic contact with the shared contact plug 102 is formed in the floating diffusion (first conductivity-type region) FD. Also, a contact region 502 meeting the condition (e.g., an impurity concentration of $5\times10^{19}$ to $1\times10^{21}$ (/cm$^3$)) of an ohmic contact with the shared contact plug 102 is formed in the gate (second conductivity-type region) 107. The foregoing is an example in which an impurity for forming a first conductivity-type semiconductor region is simultaneously implanted in the first conductivity-type region and second conductivity-type region when the concentration of the dominant impurity in the first conductivity-type region is lower than that of the dominant impurity in the second conductivity-type region. By contrast, when the concentration of the dominant impurity in the second conductivity-type region is lower than that of the dominant impurity in the first conductivity-type region, an impurity for forming a second conductivity-type semiconductor region can be simultaneously implanted in the first conductivity-type region and second conductivity-type region.

Figure 6:
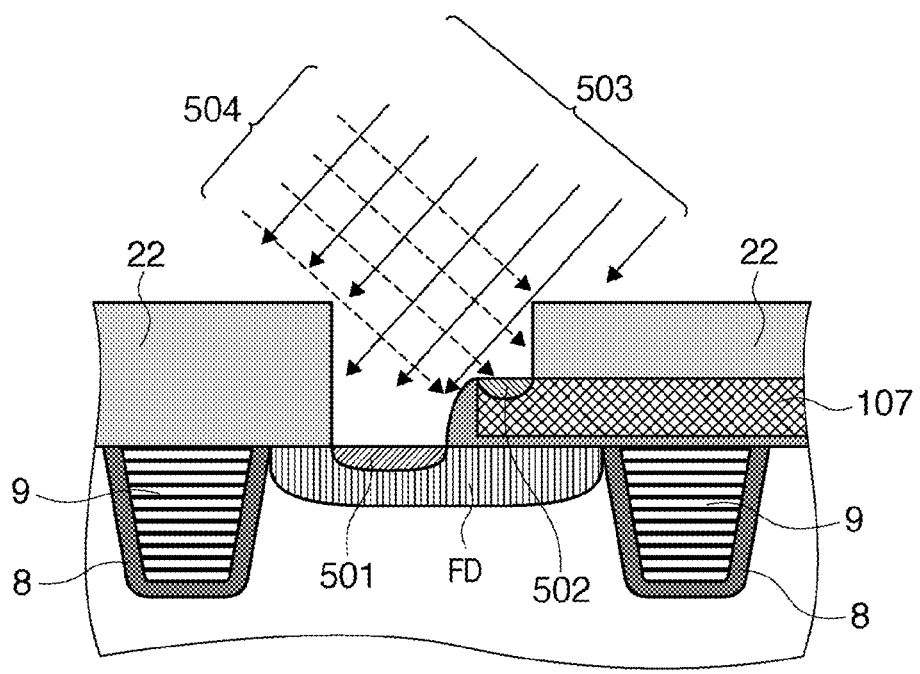
FIG. 6 is an exemplary sectional view taken along the line B-B' in FIG. 3.
Figure 11B:
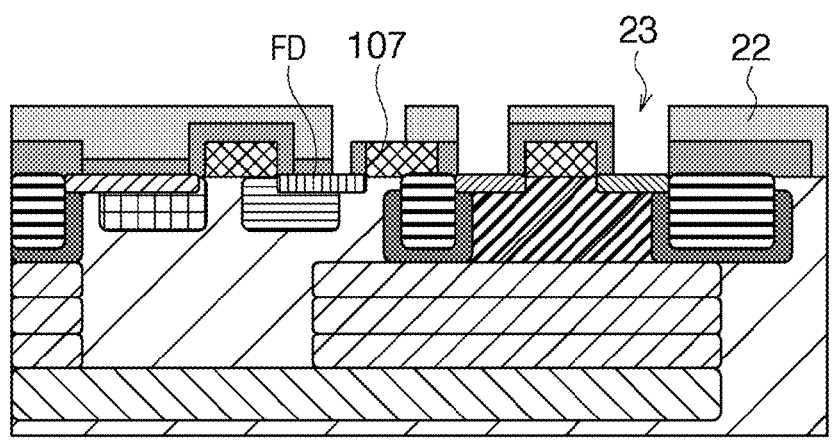

FIG. 6 exemplarily shows another example of the implantation step performed after the hole formation step shown in FIG. 11B. In this example, the implantation step includes first and second steps. In the first step, as indicated by reference numeral 503, an impurity is implanted obliquely to the surface of a member (substrate) including the floating diffusion (first conductivity-type region) FD and the gate (second conductivity-type region) 107 such that the impurity is implanted more in the floating diffusion FD than in the gate 107. In the second step, as indicated by reference numeral 504, an impurity is implanted obliquely to the surface of the member (substrate) including the floating diffusion (first conductivity-type region) FD and the gate (second conductivity-type region) 107 such that the impurity is implanted more in the gate 107 than in the floating diffusion FD. In this example, it is possible to individually control the amount of impurity implanted in the floating diffusion (first conductivity-type region) FD and the amount of impurity implanted in the gate (second conductivity-type region) 107.

In the above explanation, the floating diffusion FD and gate 107 are respectively examples of the first conductivity-type region and second conductivity-type region. Therefore, one of the first conductivity-type region and second conductivity-type region may also be the source or drain of a transistor, and the other may also be the gate.

In the plug formation step shown in FIG. 4, a barrier metal (Ti/TiN) is first formed in the contact hole 23 including the shared contact hole. Then, a shared contact plug 102 (and 105a and 111 to 113 (not shown)) is formed by filling an electrical conducting material.

Figure 12:
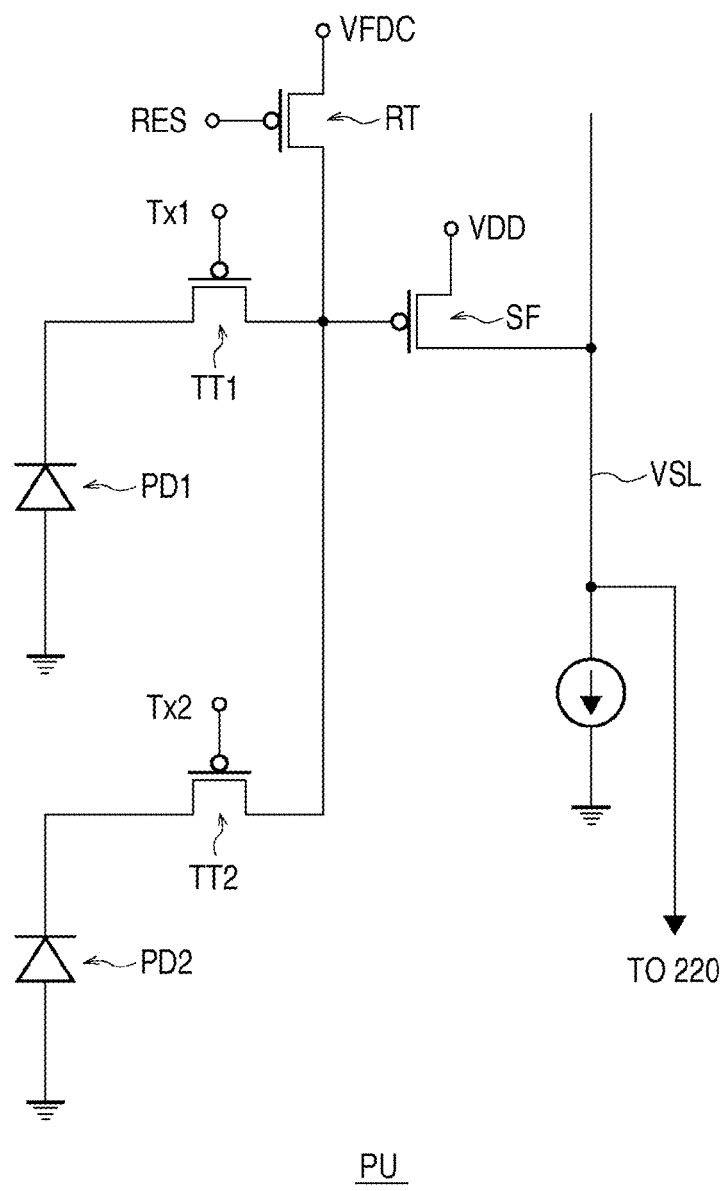
FIG. 12 is a circuit diagram showing another configuration example of the pixel unit of the pixel array.

An application of the present invention to an image sensing device of the second type will briefly be explained below. FIG. 12 is a circuit diagram showing another configuration example of the pixel unit PU of the pixel array 210. In this configuration example, PMOS transistors in the configuration example shown in FIG. 2 are replaced with NMOS transistors, and the connection of the photodiode PD is inverted. In the fabrication of the image sensing device of the second type as described above, the n-type and p-type in the above explanation need only be switched. In this case, the gate of the amplifier transistor SF is a p-type electrical conducting pattern, and the floating diffusion FD to which the gate of the amplifier transistor SF is connected by the shared contact plug 102 is an n-type region.

Figure 13:
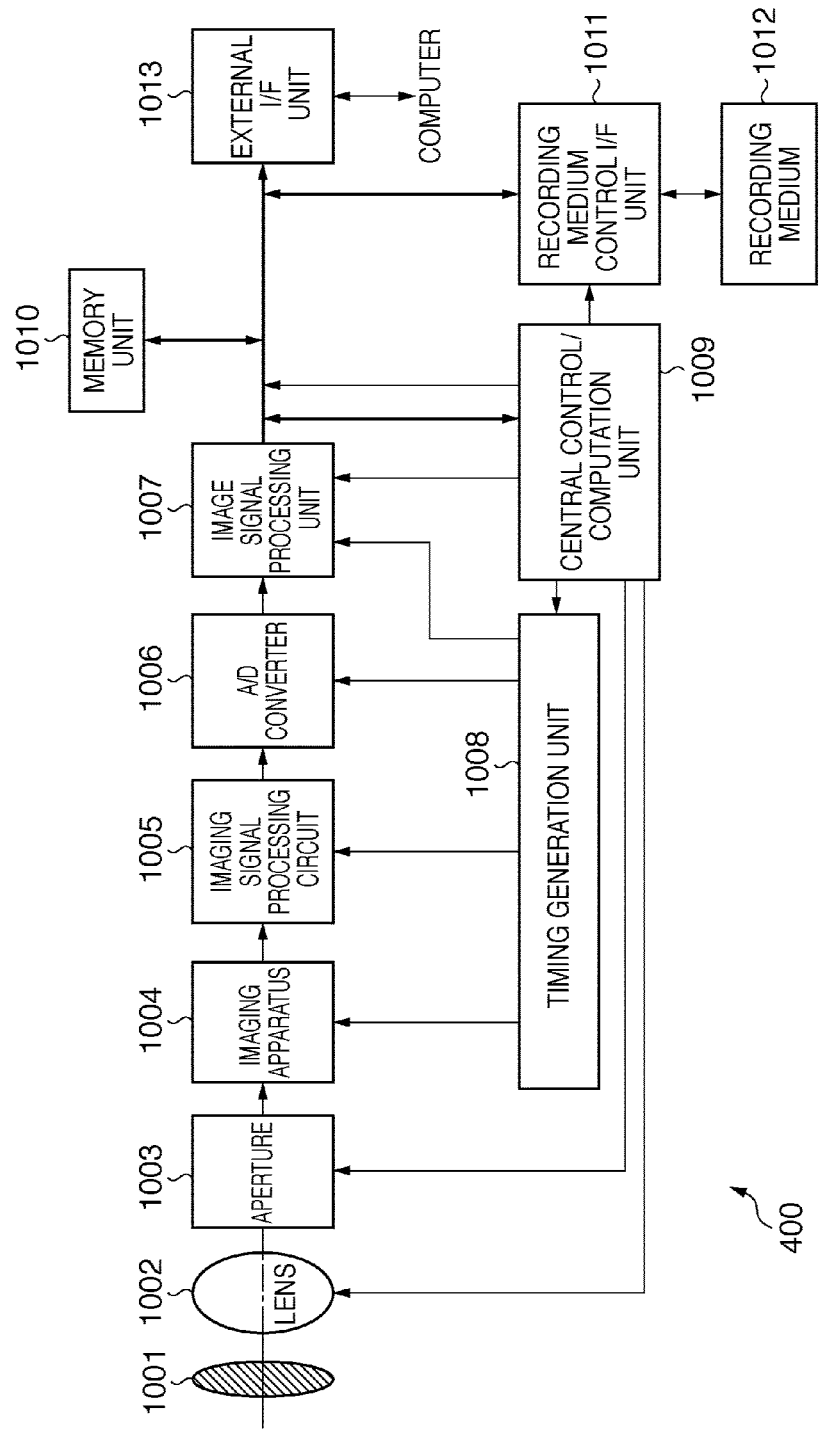
FIG. 13 is a view showing an outline of the arrangement of a camera of an embodiment of the present invention.

FIG. 13 is a view showing an outline of the arrangement of a camera of an embodiment of the present invention. Note that the concept of a camera includes not only a device whose main purpose is photographing, but also a device (e.g., a personal computer or portable terminal) subsidiarily having a photographing function. A camera 400 includes a solid-state image sensor 1004 represented by the image sensing device 200 described above. A lens 1002 forms an optical image of an object on the image sensing plane of the solid-stage image sensor 1004. A barrier 1001 that protects the lens 1002 and also functions as a main switch is formed outside the lens 1002. The lens 1002 can have a stop 1003 for adjusting the quantity of exit light from the lens 1002. An image sensing signal processing circuit 1005 performs processing such as various corrections and clamping on an image sensing signal output from the solid-state image sensor 1004. An A/D converter 1006 performs analog-to-digital conversion on an image sensing signal output from the image sensing signal processing circuit 1005. A signal processor 1007 performs signal processing such as correction and data compression on image data output from the A/D converter 1006. The solid-stage image sensor 1004, image sensing signal processing circuit 1005, A/D converter 1006, and signal processor 1007 operate in accordance with timing signals generated by a timing generator 1008.

The blocks 1005 to 1008 may also be formed on the same chip as the solid-stage image sensor 1004. An overall control/arithmetic unit 1009 controls the individual blocks of the camera 400. The camera 400 further includes a memory 1010 for temporarily storing image data, and a recording medium control interface 1011 for recording images on or reading out images from a recording medium. A recording medium 1012 includes a semiconductor memory and the like, and is detachable. The camera 400 may also include an external interface (I/F) 1013 for communicating with an external computer or the like.

The operation of the camera 400 shown in FIG. 13 will be explained below. When the barrier 1001 opens, the main power supply, the power supply of a control system, and the power supply of image sensing circuits such as the A/D converter 1006 are sequentially turned on. After that, the overall control/arithmetic unit 1009 opens the stop 1003 in order to control the exposure amount. An output signal from the solid-state image sensor 1004 is provided to the A/D converter 1006 through the image sensing signal processing circuit 1005. The A/D converter 1006 performs A/D conversion on the signal, and outputs the converted signal to the signal processor 1007. The signal processor 1007 processes the data, and provides the processed data to the overall control/arithmetic unit 1009 where an arithmetic operation of deciding the exposure amount is performed. Based on the decided exposure amount, the overall control/arithmetic unit 1009 controls the stop.

Then, the overall control/arithmetic unit 1009 extracts high-frequency components from the signal output from the solid-state image sensor 1004 and processed by the signal processor 1007, and calculates the distance to the object based on the high-frequency components. After that, the overall control/arithmetic unit 1009 drives the lens 1002, and determines whether the object is in focus. If it is determined that the object is out of focus, the overall control/arithmetic unit 1009 drives the lens 1002 again, and recalculates the distance.

After it is confirmed that the object is in focus, main exposure begins. When the exposure is complete, the image sensing signal processing circuit 1005 performs processing such as correction on an image sensing signal output from the solid-state image sensor 1004, the A/D converter 1006 performs A/D conversion on the corrected signal, and the signal processor 1007 processes the converted signal. The overall control/arithmetic unit 1009 stores the image data processed by the signal processor 1007 in the memory 1010.

After that, the image data stored in the memory 1010 is recorded on the recording medium 1012 via the recording medium control I/F under the control of the overall control/arithmetic unit 1009. The image data can also be provided to a computer or the like via the external I/F 1013 and processed by the computer or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-026702, filed Feb. 6, 2009, which is hereby incorporated by reference herein in its entirety.

What is claimed is:

1. A method of fabricating a semiconductor device, comprising the steps of:
    forming a common contact hole for a first conductivity-type region and a second conductivity-type region such that the first conductivity-type region and the second conductivity-type region are exposed;
    implanting an impurity in at least one of the first conductivity-type region and the second conductivity-type region that is an opposite type from the first conductivity type; and
    forming a shared contact plug by filling an electrical conducting material in the contact hole,
    wherein in the implanting step, an impurity is implanted in at least one of the first conductivity-type region and the second conductivity-type region such that the first conductivity-type region and the shared contact plug are brought into ohmic contact with each other, and the second conductivity-type region and the shared contact plug are brought into ohmic contact with each other.

2. The method according to claim 1, further comprising the step of forming a barrier metal in the contact hole after the step of forming a common contact hole and before the step of forming a shared contact plug.

3. The method according to claim 1, wherein in the implanting step, an impurity is simultaneously implanted in the first conductivity-type region and the second conductivity-type region.

4. The method according to claim 3, wherein
    a concentration of a dominant impurity in the first conductivity-type region is lower than that of a dominant impurity in the second conductivity-type region, and
    in the implanting step, an impurity for forming a first conductivity-type semiconductor region is simultaneously implanted in the first conductivity-type region and the second conductivity-type region.

5. The method according to claim 3, wherein
    a concentration of a dominant impurity in the first conductivity-type region is lower than that of a dominant impurity in the second conductivity-type region, and
    in the implanting step, an impurity for forming a second conductivity-type semiconductor region is simultaneously implanted in the first conductivity-type region and the second conductivity-type region.

6. The method according to claim 1, wherein the implanting step comprises the steps of:
    implanting an impurity obliquely to a surface of a member including the first conductivity-type region and the second conductivity-type region such that the impurity is implanted more in the first conductivity-type region than in the second conductivity-type region; and implanting an impurity obliquely to the surface of the member such that the impurity is implanted more in the second conductivity-type region than in the first conductivity-type region.

7. The method according to claim 1, wherein the first conductivity-type region is one of a source and a drain, and the second conductivity-type region is a gate.

8. The method according to claim 1, wherein
the semiconductor device includes a photoelectric conversion device comprising a photodiode, a floating diffusion, a transfer transistor which transfers electric charge stored in a storage region of the photodiode to the floating diffusion, and an amplifier transistor which amplifies a signal appearing in the floating diffusion, and the first conductivity-type region is the floating diffusion, and the second conductivity-type region is a gate of the amplifier transistor.

9. The method according to claim 8, wherein the amplifier transistor has a buried channel structure.

10. The method according to claim 1, wherein contact regions are formed in a part of the first conductivity-type region and a part of the second conductivity-type region in the implanting step, and the shared contact plug directly contacts with the part of the first conductivity-type region and the part of the second conductivity-type region.

* * * * *